(12) United States Patent
Zhou

(10) Patent No.: US 10,790,392 B2
(45) Date of Patent: Sep. 29, 2020

(54) SEMICONDUCTOR STRUCTURE AND FABRICATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 16 days.

(21) Appl. No.: 15/726,015

(22) Filed: Oct. 5, 2017

(65) Prior Publication Data
US 2018/0166569 A1    Jun. 14, 2018

(30) Foreign Application Priority Data
Aug. 26, 2016   (CN) .......................... 2016 1 0738843

(51) Int. Cl.
*H01L 29/78*   (2006.01)
*H01L 29/66*   (2006.01)
(Continued)

(52) U.S. Cl.
CPC ...... *H01L 29/7848* (2013.01); *H01L 21/0257* (2013.01); *H01L 21/02529* (2013.01); *H01L 21/02532* (2013.01); *H01L 21/02645* (2013.01); *H01L 21/26526* (2013.01); *H01L 21/324* (2013.01); *H01L 21/823814* (2013.01); *H01L 21/823821* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/66636* (2013.01); *H01L 29/66795* (2013.01); *H01L 29/785* (2013.01); *H01L 21/26506* (2013.01)

(58) Field of Classification Search
None
See application file for complete search history.

(56) References Cited

U.S. PATENT DOCUMENTS 9,337,339 B1    5/2016  Lee et al.
2005/0035455 A1*  2/2005  Hu ...................... H01L 29/6656
                                                            257/758

(Continued)

OTHER PUBLICATIONS

The European Patent Office (EPO) The Extended European Search Report for 17187610.5 dated Jan. 25, 2018 8 Pages.

*Primary Examiner* — Herve-Louis Y Assouman
(74) *Attorney, Agent, or Firm* — Anova Law Group, PLLC

(57) ABSTRACT

In accordance with some embodiments of the present disclosure, a semiconductor structure and a fabricating method thereof are provided. The method for forming a semiconductor structure comprises: forming a base substrate; forming a gate structure on the base substrate; forming openings in the base substrate on both sides of the gate structure; forming a barrier layer on sidewalls of the openings adjacent to the gate structure; and forming a doped layer in the openings, and forming a source region or a drain region in the doped layer.

14 Claims, 6 Drawing Sheets

(51) Int. Cl.
*H01L 21/02* (2006.01)
*H01L 21/265* (2006.01)
*H01L 21/324* (2006.01)
*H01L 21/8238* (2006.01)
*H01L 27/092* (2006.01)
*H01L 29/08* (2006.01)
*H01L 29/16* (2006.01)
*H01L 29/161* (2006.01)
*H01L 29/165* (2006.01)

(56) References Cited

U.S. PATENT DOCUMENTS

| | | | | |
|---|---|---|---|---|
| 2007/0026593 A1* | 2/2007 | Jawarani | ............ | H01L 29/1083 438/197 |
| 2007/0235802 A1* | 10/2007 | Chong | ............ | H01L 21/823807 257/346 |
| 2008/0081403 A1* | 4/2008 | Gehring | ............ | H01L 21/26506 438/187 |
| 2010/0193882 A1* | 8/2010 | Hoentschel | ............ | H01L 29/165 257/410 |
| 2011/0175140 A1* | 7/2011 | Taylor | ............ | H01J 37/321 257/190 |
| 2012/0091469 A1* | 4/2012 | Park | ............ | H01L 29/0847 257/77 |
| 2012/0153387 A1* | 6/2012 | Murthy | ............ | H01L 21/28512 257/335 |
| 2012/0223364 A1* | 9/2012 | Chung | ............ | H01L 21/823807 257/192 |
| 2013/0037822 A1* | 2/2013 | Yin | ............ | H01L 21/26506 257/77 |
| 2013/0140636 A1* | 6/2013 | Johnson | ............ | H01L 29/0847 257/347 |
| 2013/0316509 A1 | 11/2013 | Qin et al. | | |
| 2014/0113424 A1* | 4/2014 | Lin | ............ | H01L 21/02381 438/300 |
| 2014/0264636 A1* | 9/2014 | Tsai | ............ | H01L 29/66636 257/408 |
| 2015/0270342 A1* | 9/2015 | Tsai | ............ | H01L 29/0847 257/43 |
| 2016/0211371 A1 | 7/2016 | Tsai et al. | | |

* cited by examiner

SEMICONDUCTOR STRUCTURE AND FABRICATING METHOD THEREOF

CROSS-REFERENCES TO RELATED APPLICATIONS

This application claims the priority of Chinese Patent Application No. 201610738843.0, filed on Aug. 26, 2016, the entire contents of which are incorporated herein by reference.

FIELD OF THE DISCLOSURE

The present disclosure generally relates to the field of semiconductor fabricating technology and, more particularly, relates to a semiconductor structure and a fabricating method thereof.

BACKGROUND

With the rapid development of semiconductor manufacturing technology, semiconductor devices are developing towards a direction of higher component density and a higher degree of integration. Transistors as the most basic semiconductor devices are currently being widely used and, with the increasing of the semiconductor device component density and the integration degree, the gate size of the transistor is getting shorter and shorter. However, the shortened gate dimensions of the transistor can cause a short channel effect in the transistor, which results in a leakage current that ultimately affects the electrical performance of the semiconductor device.

Certain existing techniques try to improve the performance of semiconductor devices mainly by increasing the carrier mobility. When the mobility of the carriers is increased and the driving current of the transistors is increased, the leakage current in the transistors is reduced. A key factor for increasing the mobility of the carriers is to increase the stress in the channel region of the transistor. Therefore, increasing the stress in the channel region of the transistor can improve the performance of the transistor.

One method for increasing the stress in the channel region of a transistor is to form a stress layer in the source region and drain region of the transistor. A material of the stress layer in a P-type transistor can be germanium silicon material (SiGe). Since SiGe and Si have the same lattice structure, and the lattice constant of SiGe at room temperature is larger than the lattice constant of Si, a lattice mismatch exists between the silicon and the germanium silicon. As such, the stress layer can provide compressive stress to the channel region, thereby increasing the carrier mobility of the channel region in the P-type transistor.

A material of the stress layer in an N-type transistor can be carbon-silicon. Since the lattice constant of silicon-carbon at room temperature is smaller than the lattice constant of silicon, the lattice mismatch between the silicon and the carbon-silicon can increase the stress in the channel region, thereby improving the performance of the N-type transistor.

However, transistors with such stress layer may have a poor performance. Accordingly, the disclosed semiconductor structure and fabricating method thereof are directed to solve one or more problems set forth above and other problems.

BRIEF SUMMARY OF THE DISCLOSURE

In accordance with some embodiments of the present disclosure, a semiconductor structure and a fabricating method thereof are provided.

One aspect of present disclosure provides a method for forming a semiconductor structure, comprising: forming a base substrate; forming a gate structure on the base substrate; forming openings in the base substrate on both sides of the gate structure; forming a barrier layer on sidewalls of the openings adjacent to the gate structure; and forming a doped layer in the openings, and forming a source region or a drain region in the doped layer.

In some embodiments, a material of the barrier layer is same as a material of the base substrate.

In some embodiments, the base substrate is a silicon substrate; and the barrier layer includes a silicon seed layer.

In some embodiments, a thickness of the barrier layer is in a range from 35 Å to 100 Å.

In some embodiments, the barrier layer are formed on all sidewalls of the openings.

In some embodiments, the method further comprises: after forming the opening, and before forming the barrier layer, performing an amorphization treatment to a bottom portion of the openings; and after forming the barrier layer, and before forming the doped layer, performing a recrystallization treatment to the bottom portion of the openings.

In some embodiments, the amorphization treatment includes: performing an ion-implanting process to the bottom portion of the openings.

In some embodiments, the ion-implantation process includes: injecting carbon ions into the bottom portion of the openings to amorphize the bottom portion of the openings.

In some embodiments, the recrystallization treatment includes: performing an annealing treatment to the bottom portion of the openings to realize a recrystallization of the bottom portion of the openings.

In some embodiments, forming the doped layer in the openings includes: filling the openings with a semiconductor material; and performing an in-situ ion doping during the filling process to form the doped layer.

In some embodiments, a dopant concentration of the in-situ ion doping process is in a range from 1.0E21 atoms/$cm^3$ to 5.0E21 atom/$cm^3$.

In some embodiments, the method further comprises: after forming the doped layer, performing an annealing process to activate the doped layer to form a source region or a drain region.

In some embodiments, a temperature of the annealing process is in a range from 950° C. to 1100° C.; and a duration time of the annealing process is in a range from 0 s to 10 s.

In some embodiments, the method further comprises: the semiconductor structure is a fin field-effect transistor; forming the base substrate includes providing a semiconductor substrate, and etching the semiconductor substrate to form a substrate and a plurality of fin portions on the substrate; the gate structure crosses over the plurality of fin portions; the openings are formed in plurality of fin portions on both sides of the gate structure; and the material of the barrier layer is the same as a material of the plurality of fin portions.

In some embodiments, the method further comprises: the base substrate includes a first region for forming a first type transistor and a second region for forming a second type transistor; forming the gate structure includes forming a first gate structure on the base substrate in the first region, and forming a second gate structure on the base substrate in the second region, after forming the gate structure, and before forming the openings, the method further includes forming a second doped layer in the base substrate on both sides of the second gate structure; forming the openings includes forming the openings in the base substrate on both sides of the first gate structure; and forming the doped layer includes forming a first doped layer in the openings, forming a first source region or a first drain region in the first doped region, and forming a second source region or a second drain in the second doped region.

Another aspect of the present disclosure provides a semiconductor structure, comprising: a base substrate; a gate structure on the base substrate; a source region or a drain region located within the base substrate on both sides of the gate structure; and a barrier layer between the base substrate and sidewalls of the source region or the drain region adjacent to the gate structure.

In some embodiments, a material of the barrier layer is same as a material of the base substrate adjacent to the source region or drain region.

In some embodiments, the barrier layer includes a silicon seed layer.

In some embodiments, a thickness of the barrier layer is in a range from 35 Å to 100 Å.

In some embodiments, the barrier layer is positioned between the base substrate and all sidewalls of the source region or drain region.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to understand and implement the present disclosure and to realize the technical effect. It should be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

In accordance with various embodiments, the present disclosure provides a semiconductor structure and a fabricating method thereof to increase the performance of transistors with a stress layer.

Referring to FIGS. 1-4, schematic structural cross-sectional views of a semiconductor structure at certain stages of a fabricating process are shown.

Figure 1:
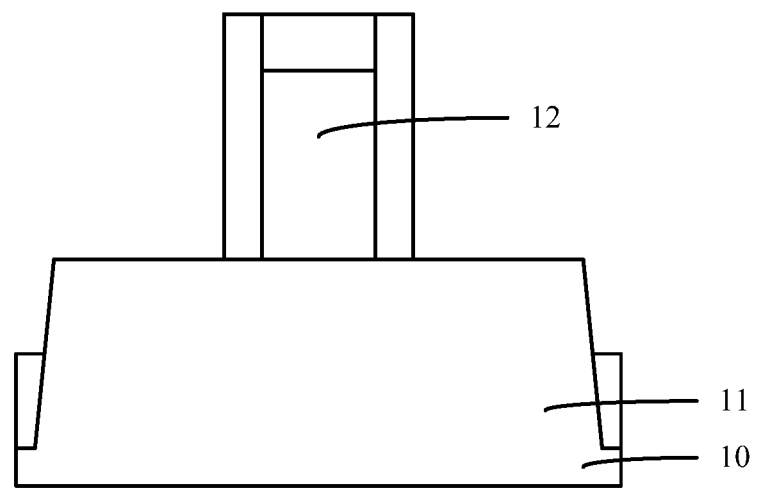
FIGS. 1-4 illustrate schematic structural cross-sectional views of a semiconductor structure at certain stages of a fabricating process.

As illustrated in FIG. 1, a substrate 10 can be provided. A fin portion 11 can be formed on the substrate 10. A gate structure 12 across the fin portion 11 can be formed on the fin portion 11. The gate structure 12 can cover the top surface and sidewalls of the fin portion 11.

Figure 2:
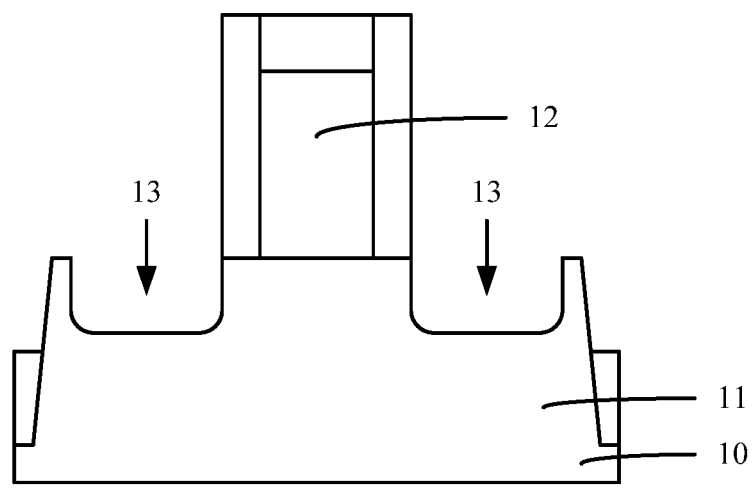

As illustrated in FIG. 2, two openings 13 can be formed in the fin portion 11 on both sides of the gate structure 12.

Figure 3:
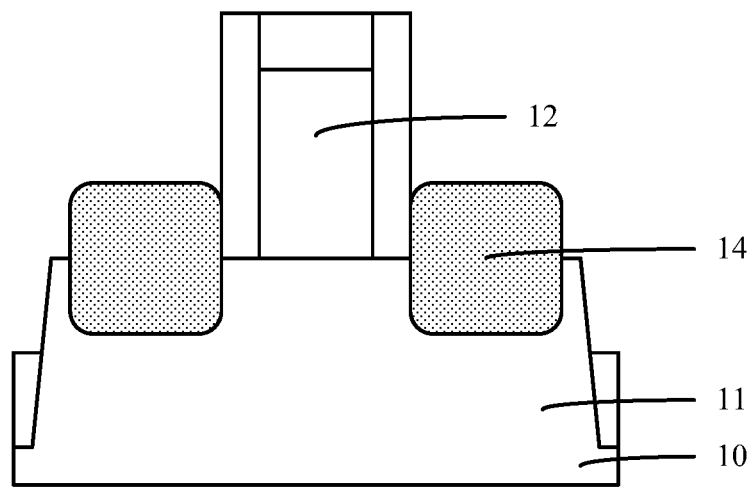

As illustrated in FIG. 3, an N-type doped layer 14 can be formed in the two openings 13 shown in FIG. 2.

Figure 4:
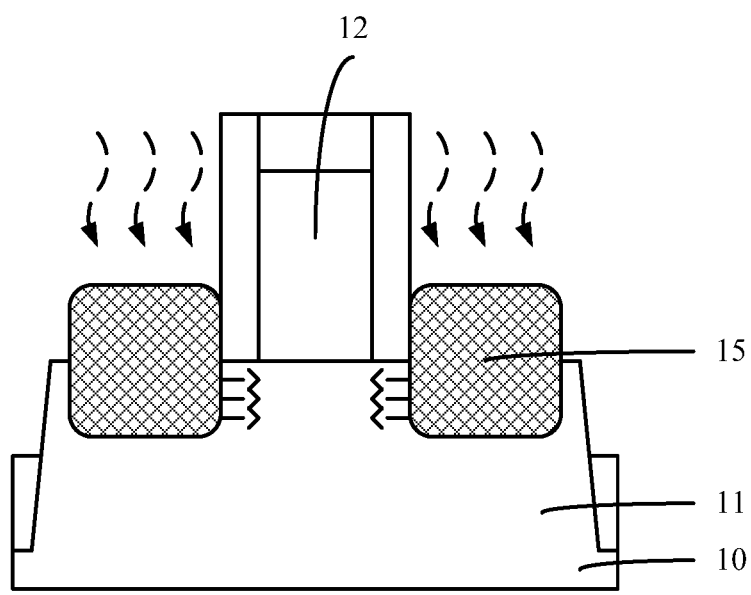

As illustrated in FIG. 4, the N-type doped layer 14 shown in FIG. 3 can be annealed to form a source region and/or a drain region 15.

Referring to FIGS. 2 to 4, a process of forming the N-type doped layer 14 includes filling the openings 13 with a semiconductor material by using an epitaxial growth method. In order to reduce the contact resistance of the source region and/or drain region 15, N-type ions can be doped into the semiconductor material by in-situ ion doping in the process of filling the semiconductor material. The doping concentration of the N-type ions are normally as high as 1.0E21 atom/cm$^3$ to 5.0E21 atom/cm$^3$.

Then, during the activation process of the annealing, the N-type ions are diffused in the plane parallel to the substrate 10 to enter the channel region below the gate structure 12. As such, the channel can be shortened to cause a short channel effect, which may result a poor performance of the formed semiconductor structure.

Figure 12:
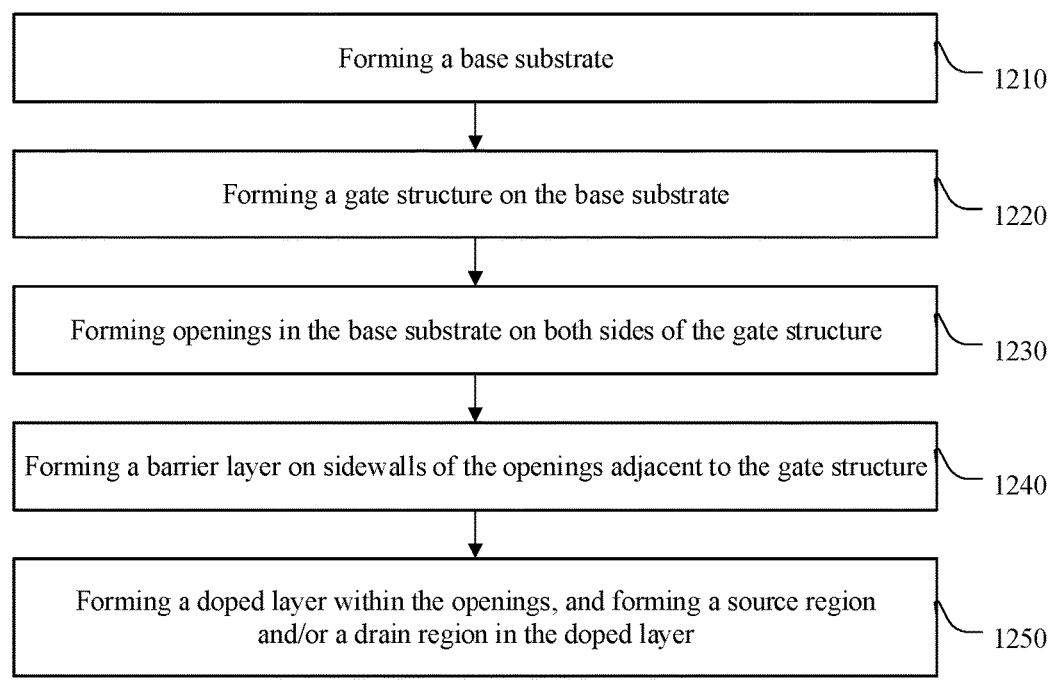
FIG. 12 illustrates a schematic flow diagram of an exemplary method for fabricating a semiconductor structure in accordance with some embodiments of the present disclosure.

Accordingly, the present disclosure provided an improved method for fabricating a semiconductor structure. Referring to FIG. 12, a schematic flow diagram of an exemplary method for fabricating a semiconductor structure is shown in accordance with some embodiments of the present disclosure. At step 1210, a base substrate can be formed. At step 1220, a gate structure can be formed on the base substrate. At step 1230, openings can be formed in the base substrate on both sides of the gate structure. At step 1240, a barrier layer can be formed on sidewalls of the openings adjacent to the gate structure. At step 1250, a doped layer can be formed within the openings, and a source region and/or a drain region can be formed in the doped layer.

The details of each of the steps, the foregoing objects, the features and the advantages of the improved method for fabricating a semiconductor structure are described in the following various embodiments in connection with FIGS. 5-11.

In some embodiments, after forming the openings in the base substrate on both sides of the gate structure, the barrier layer can be formed on the sidewalls of the openings adjacent to the gate structure. Then, a doped layer can be formed in the openings that have the barrier layer on the sidewalls. During the formation of the source region and/or the drain region, the barrier layer can effectively prevent the dopant ions in the doped layer from diffusing into the channel region below the gate structure. Therefore, the short channel effect due to the diffusion of the dopant ions can be alleviated, and the performance of the formed semiconductor structure can be improved.

It should be noted that the above steps of the flow diagram of FIG. 12 can be executed or performed in any order or sequence not limited to the order and sequence shown and described in the figure. Also, some of the above steps of the flow diagram of FIG. 12 can be executed or performed substantially simultaneously where appropriate or in parallel to reduce latency and processing times. Furthermore, it should be noted that FIG. 12 is provided as an example only. At least some of the steps shown in the figure may be performed in a different order than represented, performed concurrently, or altogether omitted.

Referring to FIGS. 5-11, schematic structural cross-sectional views of an exemplary semiconductor structure at certain stages of a fabricating process are shown in accordance with some embodiments of the present disclosure.

Figure 5:
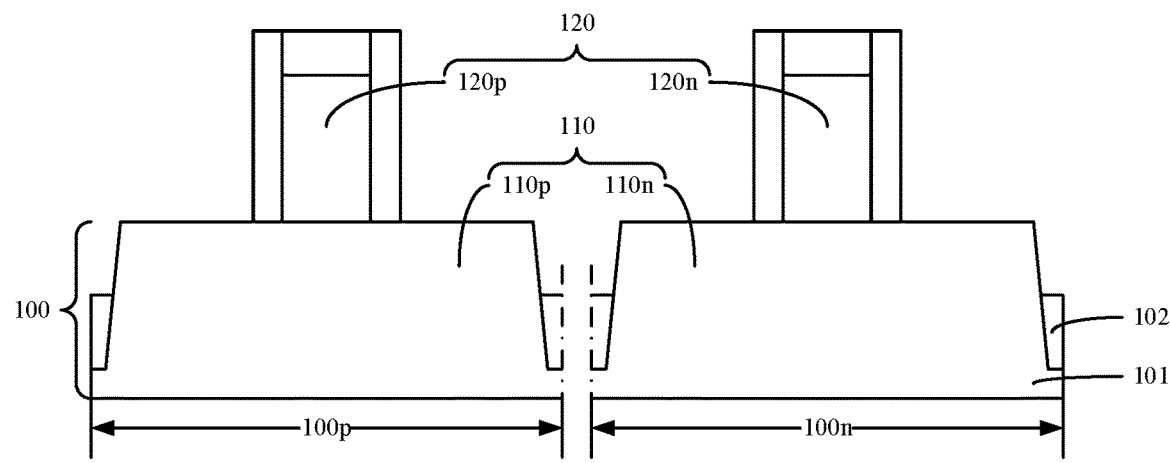
FIGS. 5-11 illustrate schematic structural cross-sectional views of an exemplary semiconductor structure at certain stages of a fabricating process in accordance with some embodiments of the present disclosure.

Turning to FIG. 5, a base substrate 100 can be formed (step 1210).

In some embodiments, the semiconductor structure can be used to form a fin field-effect transistor, and thus the base substrate 100 can include a substrate 101 and multiple fin portions 110 on the substrate 101.

A process for forming the base substrate 100 can include the following steps. A semiconductor substrate can be provided. The semiconductor substrate can be etched to form the substrate 101 and the multiple fin portions 110 on the substrate 101.

The semiconductor substrate can be used to provide an operating platform for subsequent processes, and to be etched to form the substrate 101 and the multiple fin portions 110.

In some embodiments, a material of the semiconductor substrate may be monocrystalline silicon, polycrystalline silicon, or amorphous silicon. In some other embodiments, the material of the semiconductor substrate may be silicon, germanium, gallium arsenide, or silicon germanium compounds. In one special embodiment, the semiconductor substrate is a monocrystalline silicon substrate, and the material of the substrate 101 and the multiple fin portions 110 is monocrystalline silicon.

In some other embodiments, the material of the semiconductor substrate may have an epitaxial layer, or a silicon on epitaxial layer structure. In particular, the semiconductor substrate may include a substrate and a semiconductor layer on the surface of the substrate. The substrate may be a silicon substrate, a silicon-germanium substrate, a silicon carbide substrate, a silicon-on-insulator substrate, a germanium-on-insulator substrate, a glass substrate, or a group III-V compound substrate such as a gallium nitride substrate or a gallium arsenide substrate.

A material of the semiconductor layer may be silicon, germanium, silicon carbide, or silicon germanium. The choice of substrate and semiconductor layer is not limited. A material that is suitable for process requirements, easy to be integrated, and suitable for forming the multiple fin portions can be selected. The semiconductor layer may be formed on the surface of the substrate by an epitaxial deposition, so that the height of the multiple fin portions formed can be precisely controlled by the epitaxial process.

A process for etching the semiconductor substrate can include the following steps. A fin pattern layer can be formed on the surface of the semiconductor substrate. Using the fin pattern layer as a mask, the semiconductor substrate can be etched to form base substrate 100 including the substrate 101 and the at least multiple fin portions 110.

The fin pattern layer is used to define the position and size of the multiple fin portions 110. A process for forming the fin pattern layer can include the following steps. A fin pattern material layer can be formed on the surface of the semiconductor substrate. A patterned layer can be formed on the surface of the fin pattern material layer. Using the pattern layer as a mask, the fin pattern material layer can be etched to expose the surface of the semiconductor substrate to form the fin pattern layer. In particular, a material of the fin pattern layer may be silicon nitride or titanium nitride.

Before forming the fin pattern layer, a buffer layer (not shown in the figures) can be formed on the surface of the semiconductor substrate to reduce the lattice mismatch between the fin pattern layer and the semiconductor substrates. In particular, a material of the buffer layer may be an oxide.

In some embodiments, the patterned layer can be a patterned photoresist layer formed by a coating process and a photolithographic process. In addition, in order to reduce the feature size of the multiple fin portions 110, and to reduce the distances 102 between adjacent fin portions, the formation of the patterned layer can also include multiple patterning processes. The multiple patterning processes can include a self-aligned double patterned (SaDP) process, a self-aligned triple patterned (SaTP) process, or a self-aligned quadratic patterning (SaDDP) process.

It should be noted that, after forming the substrate 101 and the multiple fin portions 110, a liner oxide layer (not shown in the figures) can be formed on the surface of the substrate 101 and the multiple fin portions 110. The formation of the liner oxide layer can be used for repairing surface damage and irregularities, and also for smoothing the sharp corners on the surfaces of the substrate 101 and the multiple fin portions 110. Furthermore, the liner oxide layer can also act as a buffer layer between the subsequently formed film layers and the substrate 101 as well as the multiple fin portions 110 to alleviate the lattice mismatch problem.

In some embodiments, an isolation structure 102 can be formed between the adjacent fin portions 110 to achieve electrical isolation. A material of the isolation structure 102 may include silicon oxide, silicon nitride, silicon oxynitride, a low-K dielectric material having a dielectric constant greater than or equal to 2.5 and less than 3.9, an ultra-low-K dielectric material having a dielectric constant less than 2.5, or a combination thereof.

A process for forming the isolation structure 102 can include the following steps. Firstly, an isolation material layer can be formed to fill the gaps between the adjacent fin portions 110. A top surface of the isolation material layer is higher than the top surfaces of the multiple fin portions 110. Then, an upper portion of the isolation material layer can be removed to expose a portions of the sidewalls of the multiple fin portions 110 and to form the isolation structure 102.

In order to ensure a sufficient filling of the gaps between the adjacent fin portions by the isolation material layer, the isolation material layer can be formed by a fluid chemical vapor deposition (FCVD) process.

A process to remove the upper portion of the isolation material layer can include the following steps. The top surface of the isolation material layer can be planarized by chemical mechanical polishing, such that the top surface of the isolation material layer is in a same level with the top surfaces of the multiple fin portions 110. The upper portion of the isolation material layer can be removed by an etching-back process to expose the top surfaces and a portions of the sidewalls of the multiple fin portions 110 and to form the isolation structure 102.

It should be noted that, the planarization process can remove not only an upper portion of the isolation material layer, but also the fin pattern layer on the top surfaces of the multiple fin portions 110 to expose the top surface of the multiple fin portions 110.

The base substrate 100 can include a first region 100n for forming a first type transistor, and a second region 100p for forming a second type transistor. As such, one fin portion 110 located on the substrate 101 in the first region 100n can be referred as a first fin portion 110n, and another fin portion 110 located on the substrate 101 in the second region 100p can be referred as a second fin portion 110p. In particular, the first type transistor can be an N-type transistor, and the second type transistor can be a P-type transistor.

Still referring to FIG. 5, a gate structure 120 can be formed on the substrate 100 (step 1220).

In some embodiments, the gate structure 120 may be a gate structure of the formed semiconductor structure used for controlling the opening and closing of the channel of the formed semiconductor structure. In some other embodiments, the gate structure 120 may be a dummy gate structure used for defining the size and position of the subsequently formed gate structure, and for protecting the channel region of the semiconductor structure during the formation of the semiconductor structure.

In some embodiments, when the gate structure 120 is a gate structure of the formed semiconductor structure, the gate structure 120 can include a gate dielectric layer (not shown in the figures) on the base substrate 100, a gate electrode (not shown in the figures) on the gate dielectric layer, and gate sidewall spacers (not shown in the figures) on the sidewalls of the gate dielectric layer and the gate electrode.

A material of the gate dielectric layer may be an oxide or may include a high-K dielectric material. In some embodiments, the gate dielectric layer can be a high-K dielectric layer, and the material of the gate dielectric layer may be selected from the hafnium oxide, zirconium oxide, hafnium oxide, lanthanum oxide, zirconium oxide, titanium oxide, tantalum oxide, barium strontium titanium, titanium oxide barium oxide, strontium titanium oxide, aluminum oxide, or any other suitable high-K materials.

A material of the gate electrode may be metal or polysilicon. In some embodiments, the material of the gate electrode can be metal.

The gate sidewall spacers can be located on the sidewalls of the gate dielectric layer and the gate electrode to prevent the dopant ions in the source region and/or drain region from being too close to the channel, thereby reducing the occurrence of the source-drain punch-through phenomenon. In some embodiments, a material of the gate sidewall spacers can include silicon nitride.

In some other embodiments, when the gate structure 120 is a dummy gate structure, the gate structure 120 can include a gate dielectric layer on the base substrate, a dummy gate electrode on the gate dielectric layer, and gate sidewall spacers located on the sidewalls of the gate dielectric layer and the dummy gate electrode.

A process for forming the gate structure 120 can include the following steps. A gate material layer can be formed on the surface of the base substrate 100. The gate material layer can include a dielectric material layer, and an electrode material layer on the surface of the dielectric material layer. A gate pattern layer can be formed on the surface of the electrode material layer for defining the size and position of the gate structure 120. Using the gate pattern layer as a mask, the gate material layer can be etched to expose the surface of the base substrate 100 to form the gate structure 120.

A process for forming the gate material layer can include the following steps. The dielectric material layer and the electrode material layer on the surface of the dielectric material layer can be formed on the surface of the base substrate 100 by using a deposition process such as chemical vapor deposition, physical vapor deposition, or atomic layer deposition. The gate pattern layer can be a patterned photoresist layer formed by a coating process and a photolithographic process. The gate material layer can be etched by an anisotropic dry etching process.

In some other embodiments, the gate pattern layer may be a mask layer formed by a multiple patterned mask process to reduce the size of the gate structure and to reduce the size of the formed semiconductor structure.

In some embodiments, the base substrate 100 includes the substrate 101 and multiple fin portions 110 on the substrate 101, such that the gate structure 120 is located on the multiple fin portions 110 and covers the top surfaces and a portion of the sidewall surfaces of the multiple fin portions 110.

In addition, the base substrate 100 includes the first region 100n and the second region 100p, and thus a process for forming the gate structure 120 includes forming a first gate structure 120n on the base substrate 100 in the first region 100n, and forming a second gate structure 120p on the base substrate 100 in the second region 100p.

The first gate structure 120n can be located on and across the first fin portions 110n, and can cover the top surface and a portion of the sidewall surfaces of the first fin portions 110n. The second gate structure 120p can be located on and across the second fin portions 110p, and can cover the top surface and a portion of the sidewall surfaces of the second fin portions 110p.

After forming the gate structure 120, the multiple fin portions on both sides of the gate structure 120 can be doped by using a light doped drain (LDD) implant process, and a pocket implant process.

Figure 6:
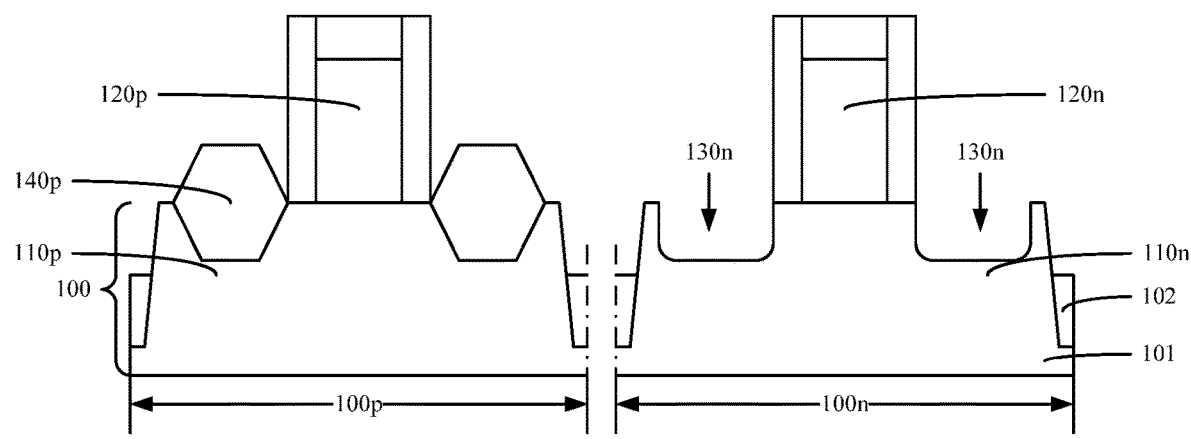

Turning to FIG. 6, openings 130n can be formed in the base substrate 100 on both sides of the gate structure respectively (step 1230).

In some embodiments, the opening 130n can be formed in the base substrate 100 on both sides of the first gate structure 120n. Specifically, the opening 130n are formed in the first fin portions 110n on both sides of the first gate structure 120n.

The openings 130n can be used for filling a first semiconductor material to form a first doped layer. In some embodiments, the first region 100n is used for forming an N-type transistor, so that the cross section of the openings 130n can be U-shaped or square-shaped.

In some embodiments, the openings 130n may be formed by a mask dry etching process. Specifically, using the first gate structure 120n as a mask, the first fin portions 110n can be etched on the both sides of the first gate structure 120n to form the openings 130n in the first fin portions 110n.

In some embodiments, the base substrate 100 further includes a second region 100p for forming the second-type transistor. So after forming the gate structure 120 as shown in FIG. 5, and before forming the openings 130n, a second doped layer 140p can be formed within the second fin portions 110p on both sides of the second gate structure 120p.

The second doped layer 140p is used to form a source region and/or a drain region of the transistor in the second region 100p. In some embodiments, the second region 100p is used to form a P-type transistor, and the dopant ions in the second doped layer 140p can be P-type ions such as boron ions, gallium ions, or arsenic ions.

In addition, since the second region 100p is used to form a P-type transistor, a material of the second doped layer 140p can be germanium-silicon. The second doped layer 140p can be Σ-shaped for increasing the carrier mobility.

A process for forming the second doped layer 140p can include the following steps. Using the second gate structure 120p as a mask, the second fin portions 110p can be etched on both sides of the second gate structure 120p to form Σ-shaped second region openings in the fin portions 110p. The second region openings can be filled with a germanium silicon material by an epitaxial growth technique, and be doped by an in-situ doping process to form the second doped layer 140p.

Figure 7:
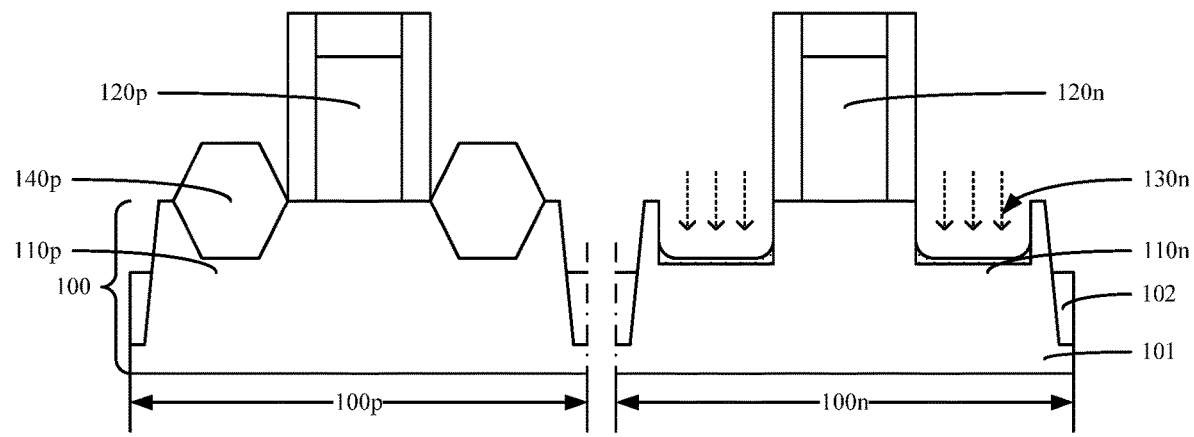
Figure 8:
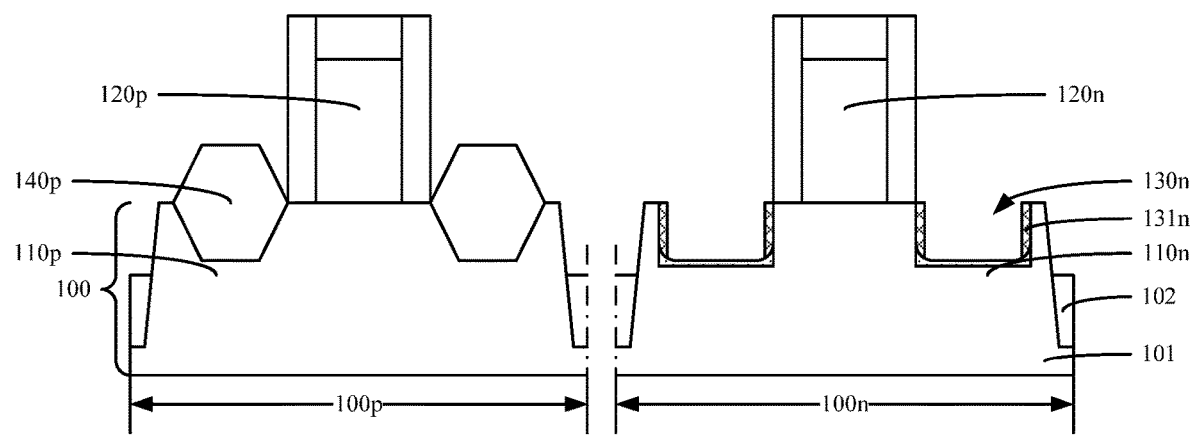

Turning to FIGS. 7 and 8, a barrier layer 131n can be formed on sidewalls of the openings 130n adjacent to the gate structure (step 1240).

Since the openings 130n are located in the first fin portions 110n on both sides of the first gate structure 120n, the barrier layer 131n can be formed on the sidewalls of the openings 120n adjacent to the first gate structure 120n.

In order to avoid an influence of the barrier layer 131n to the performance of the transistor, a material of the barrier layer 131n can be the same material of the sidewalls of the opening 130. In particular, the openings are located within the fin portions on both sides of the gate structure. That is, the openings 130n are located within the fin portions and are surrounded by the material of the fin portions. In some embodiments, the openings 130n are located in the first fin portions 110n, so that the material of the barrier layer 131n is the same material of the first fin portions 110n.

Since the material of the first fin portions 110n is monocrystalline silicon, the material of the barrier layer 131 is also monocrystalline silicon. Specifically, in some embodiments, the barrier layer 131n can be a silicon seed layer. Since the density of the silicon seed layer can be relatively large, the diffusion of the dopant ions in the plane parallel to the surface of the base substrate 100 can be effectively blocked. In particular, the barrier layer 131n may be formed on the sidewalls of the openings 130n by an atomic layer deposition.

It should be noted that, in order to reduce a process difficulty of forming the barrier layer 131n, the barrier layer 131n can be formed on sidewalls on both sides of the openings 130n. That is, the barrier layer 131n can be formed on all sidewalls of the openings 130n.

If a thickness of the barrier layer 131n is too small, it is difficult to realize the function of blocking the diffusion of the dopant ions in the subsequent process. If the thickness of the barrier layer 131n is too large, it may have a material waste and an increased process difficulty. Specifically, in some embodiments, the thickness of the barrier layer 131n can in a range from 35 Å to 100 Å.

In order to reduce the resistance of the formed transistor and improve the performance of the formed semiconductor structure, in some embodiments, the barrier layer 131n can cover only the sidewalls of the openings 130n. That is, the bottom surfaces of the openings 130n may not be covered by the barrier layer 131n.

Specifically, in order to avoid the formation of the barrier layer 131n on the bottom surfaces of the openings 130n, in some embodiments as shown in FIG. 7, after forming the openings 130n, and before forming the barrier layer 131n, an amorphization treatment can be performed on the bottom surface of the openings 130n.

The amorphization process can decrease the atomic arrangement symmetry of the bottom surface of the openings 130n, thereby reducing the possibility of atoms depositing on the bottom surfaces of the openings 130n during the formation of the barrier layer 131n. Thus, the probability of forming a barrier layer 131n on the bottom surfaces of the openings 130n can be reduced.

In some embodiments, the amorphizing process can include an ion-implanting to the bottom portion of the openings 130n. In particular, the bottom portion of the openings 130n can be amorphized by injecting carbon ions into the bottom portion of the openings 130n.

Figure 9:
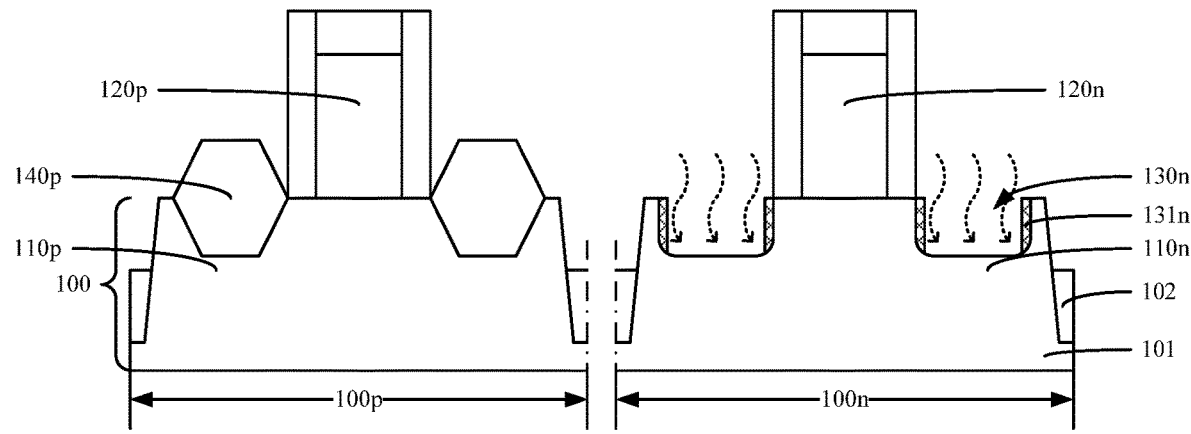
Figure 10:
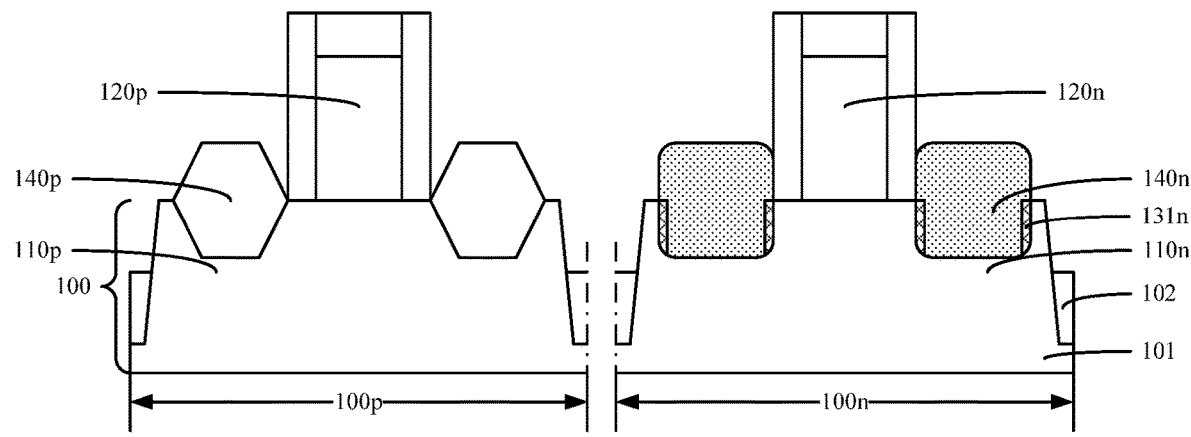

Turning to FIGS. 9 and 10, a doped layer can be formed in the openings 131n, and a source region and/or a drain region can be formed in the doped layer (step 1250).

Specifically, a first doped layer 140n can be formed in the openings 131n. The first doping layer 140n can be used to form a source region and/or a drain region of the transistor in the first region 100n. The openings 131n are filled with a semiconductor material by an epitaxial growth process to form the first doping layer 140n.

It should be noted that, the atomic arrangement symmetry of the bottom surfaces of the openings 130n may be relatively too low to fill the semiconductor material. Therefore, as shown in FIG. 9, after forming the barrier layer 131n, a crystallization treatment can be performed on the bottom portion of the openings 130n.

In some embodiments, an annealing treatment can be performed to the bottom portion of the openings 130n to realize the recrystallization. In particular, the annealing process can enable the atoms of the bottom surfaces of the openings 130n to be re-relaxed to the lattice positions to realize the recrystallization.

After the bottom portion of the opening 130n is recrystallized, the first doped layer 140n can be formed by filling the semiconductor material in the openings 130n and an in-situ ion doping during the filling process.

Specifically, since the first region 100n is used to form an N-type transistor, the semiconductor material filled in the opening 130n can be a carbon-silicon material. That is, the material of the first doped layer 140n is carbon-silicon. The dopant ions of the in-situ ion doping can be N-type ions such as phosphorus ions, arsenic ions, or antimony ions. In one embodiment, the dopant ions in the first doping region 140n are phosphorus ions.

In some embodiments, the in-situ ion doping concentration can be relatively high, which is advantageous in lowering the resistance of the formed transistor and improving the performance of the formed semiconductor structure. In particular, the in-situ ion doping concentration can be in a range from 1.0E21 atoms/cm$^3$ to 5.0E21 atom/cm$^3$.

Figure 11:
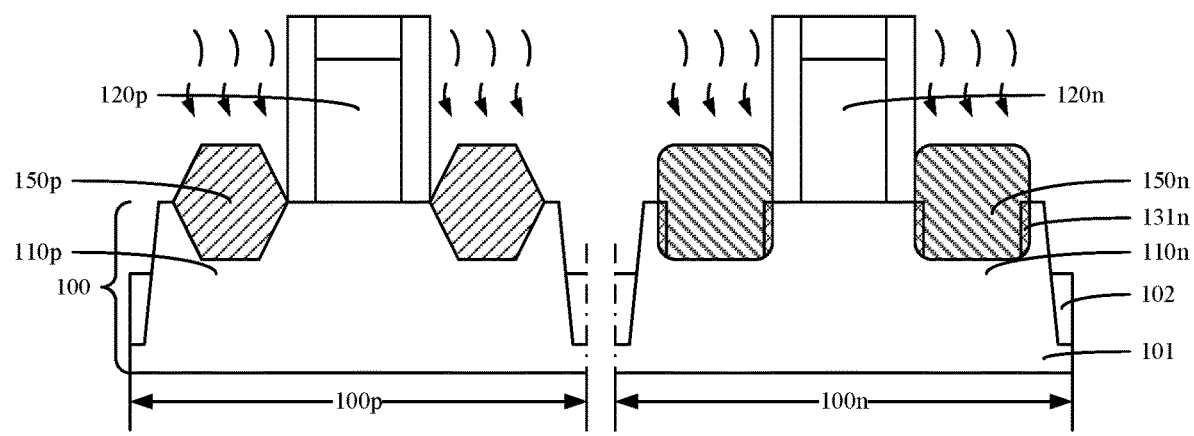

Turning to FIG. 11, after forming the doped layer, the doping layer can be annealed to form a source region and/or a drain region.

In some embodiments, as shown in FIG. 6, the base substrate further includes the second region 100p, and the second doped region 140p is formed in the second fin portions 110p in the second region 100p. Therefore, as shown in FIG. 10, an annealing process can be performed to activate the first doping layer 140n and the second doping layer 140p. As such, a first source region and/or a drain region 150n can be formed in the first doped layer 140n, and a second source region and/or a second drain region 150p can be formed in the second doped layer 140p.

The annealing process can activate the dopant ions in the first doping region 140n and the second doping region 140p to lattice positions, thereby realizing the activation of the dopant ions. Specifically, in the annealing process, an annealing temperature can be in a range from 950° C. to 1100° C., and an annealing time can be in a range from 0 s to 10 s.

During the annealing process, the dopant ions in the first doped region 140*n* can be diffused. The diffusion of the dopant ions in the plane parallel to the surface of the base substrate 100 can be blocked due to the formation of the barrier layer 131*n*. Particularly, the barrier layer 131*n* adjacent to the first gate structure 120*n* can be located between the first doped region 140*n* and the first fin portions 110*n*, thus can prevent the dopant ions from diffusing into the channel region below the first gate structure 120*n*. Therefore, the short channel effect due to the diffusion of the dopant ions can be mitigated, thereby improving the performance of the formed semiconductor structure.

In addition, the barrier layer 150*n* can be located only between the sidewalls of the first doping region 140*n* and the base substrate 100, but not formed between bottom surfaces of the first doping region 140*n* and the base substrates 100. Thus, during the annealing process, the dopant ions can diffuse in a direction perpendicular to the surface of the base substrate 100. Such diffusion of the dopant ions in the direction away from the surface of the base substrate 100 can reduce the resistance of the formed transistor and improve the performance of the formed semiconductor structure.

Accordingly, the present disclosure also provides a semiconductor structure. Reference to FIG. 11, a schematic structural cross-sectional diagram of an exemplary semiconductor structure is shown in accordance with some embodiments of the present disclosure.

In some embodiments, the semiconductor structure can include a base substrate 100, a gate structure on the base substrate, a source region and/or a drain region in the base substrate 100 on both sides of the gate structure, and a barrier layer 131*n* between the base substrate 100 and the sidewalls of the source region and/or drain region.

The base substrate 100 can be used to provide an operating platform for semiconductor processes. In some embodiments, the semiconductor structure can be a fin field-effect transistor, so the base substrate 100 includes a substrate 101 and multiple fin portions on the substrate 101.

The substrate 101 can be used to provide an operating platform for subsequent processes. The fin portions can be used to form a fin field-effect transistor. In some embodiments, a material of the substrate and the fin portions may be monocrystalline silicon, polycrystalline silicon, or amorphous silicon. In some other embodiments, the material of the substrate and the fin portions may be silicon, germanium, gallium arsenide, silicon germanium compounds, or any other suitable semiconductor material. In one special embodiment, the material of the substrate and the fin portions is monocrystalline silicon.

In some embodiments, isolation structures 102 can be formed between the adjacent fin portions 110 to achieve electrical isolation. The top surface of the isolation structure 102 can be lower than the top surface of the fin portions to expose the sidewalls of the fin portions, such that the subsequently formed gate structure can cover the sidewalls of the fin portions.

A material of the isolation structure 102 may include silicon oxide, silicon nitride, silicon oxynitride, a low-K dielectric materials having a dielectric constant greater than or equal to 2.5 and less than 3.9, an ultra-low-K dielectric materials having a dielectric constant less than 2.5, or a combination thereof.

In some embodiments, the base substrate 100 can include a first region 100*n* for forming a first type transistor, and a second region 100*p* for forming a second type transistor. As such, one fin portion 110 located on the substrate 101 in the first region 100*n* can be refer as a first fin portion 110*n*, and another fin portion 110 located on the substrate 101 in the second region 100*p* can be referred as a second fin portion 110*p*. In particular, the first type transistor can be an N-type transistor, and the second type transistor can be a P-type transistor.

In some embodiments, the gate structure may be used for controlling the opening and closing of the channel of the formed semiconductor structure.

In some embodiments, the base substrate 100 includes the substrate 101 and multiple fin portions on the substrate 101, so that the gate structure is located on and across the multiple fin portions. The gate structure can cover the top surface and sidewalls of the multiple fin portions.

The base substrate 100 includes the first region 100*n*, the second region 100*p*, multiple first fin portions 110*n* on the substrate 101 in the first region 100*n*, and multiple second fin portions 110*n* on the substrate 101 in the second region 110*p*.

In some embodiments, the gate structure 120 can include a gate dielectric layer (not shown in the figures) on the base substrate 100, a gate electrode (not shown in the figures) on the gate dielectric layer, and gate sidewall spacers (not shown in the figures) on the sidewalls of the gate dielectric layer and the gate electrode.

A material of the gate dielectric layer may be an oxide or may include a high-K dielectric material. In some embodiments, the gate dielectric layer can be a high-K dielectric layer, and the material of the gate dielectric layer may be selected from the hafnium oxide, zirconium oxide, hafnium oxide, lanthanum oxide, zirconium oxide, titanium oxide, tantalum oxide, barium strontium titanium, titanium oxide barium oxide, strontium titanium oxide, aluminum oxide, or any other suitable high-K materials.

A material of the gate electrode may be metal or polysilicon. In some embodiments, the material of the gate electrode can be metal.

The gate sidewall spacers can be located on the sidewalls of the gate dielectric layer and the gate electrode to prevent the dopant ions in the source region and/or drain region from being too close to the channel, thereby reducing the occurrence of the source-drain punch-through phenomenon. In some embodiments, a material of the gate sidewall spacers can include silicon nitride.

The source region and/or drain region can be used for forming a source region and/or a drain region of a semiconductor structure transistor.

In some embodiments, the base substrate 100 includes the substrate 101 and multiple fin portions 110 on the substrate 101, so that the source region and/or drain region can be located within the fin portions on both sides of the gate structure.

The substrate 100 includes the first region 100*n* and the second region 100*p*, such that the source region and/or drain region can include a first source region and/or drain region 150*n* located within the first fin portions 110*n* on both sides of the first gate structure 120*n*, and a second source region and/or drain region 150*p* located within the second fin portions 110*p* on both sides of the second gate structure 120*p*.

Specifically, the first region 100*n* is used for forming an N-type transistor, and the second region 100*p* is used for forming a P-type transistor. As such, the first source region and/or drain region 150*n* can have N-type dopant ions, such as phosphorus ions, arsenic ions, or antimony ion. The second source region and/or drain region 150*p* can have P-type dopant ions, such as boron ions, gallium ions, or indium ions.

The barrier layer 131n can be used to prevent the dopant ions in the source region and/or drain region from diffusing into the channel region below the gate structure. As such, the short channel effect due to the diffusion of the dopant ions can be alleviated, and thereby the performance of the formed semiconductor structure can be enhanced.

It should be noted that, in some embodiments, the barrier layer 131n can be formed between the base substrate and the sidewalls of the source region and/or drain region that are away from the gate structure. That is, the barrier layer 131n can be formed between the base substrate 100 and all sidewalls of the source region and/or drain region. In some embodiments, the barrier layer 131n is located between the sidewalls of the first source region and/or drain region 150n and the first fin portions 110n.

In order to avoid an influence of the barrier layer 131n to the performance of the transistor, a material of the barrier layer 131n can be the same material of the base substrate 100 close to the source region and/or drain region. In particular, the material of the barrier layer 131n is the same material of the first fin portions 110n.

Since the material of the first fin portions 110n is monocrystalline silicon, the material of the barrier layer 131 is also monocrystalline silicon. Specifically, in some embodiments, the barrier layer 131n can be a silicon seed layer. Since the density of the silicon seed layer can be relatively large, the diffusion of the dopant ions in the plane parallel to the surface of the base substrate can be effectively blocked.

It should be noted that, if a thickness of the barrier layer 131n is too small, it is difficult to realize the function of blocking the diffusion of the dopant ions in the subsequent process. If the thickness of the barrier layer 131n is too large, it may have a material waste as well as an increased process difficulty. Specifically, in some embodiments, the thickness of the barrier layer 131n can in a range from 35 Å to 100 Å.

Accordingly, a semiconductor structure and a fabricating method thereof are provided.

In the disclosed semiconductor structure, openings can be formed in a base substrate on both sides of a gate structure, and a barrier layer can be formed on sidewalls of the openings adjacent to the gate structure. A doped layer can then be formed in the openings having the barrier layer formed on the sidewalls. The formation of the barrier layer can effectively reduce the diffusion of dopant ions in the doped layer into the channel region below the gate structure during the formation of the source region and/or drain region. As such, the short channel effect due to the diffusion of the dopant ions can be alleviated, and the performance of the formed semiconductor structure can be improved.

Furthermore, in the disclosed semiconductor structure, by amorphizing the bottom portion of the openings, the bottom portion of the openings can be prevented from being covered by the barrier layer. Therefore, during the formation of the source region and/or drain region, the dopant ions in the doped layer can diffuse in a direction perpendicular to the surface of the base substrate. Such diffusion of dopant ions in the direction away from the surface of the substrate can decrease the resistance of the transistor and enhance the performance of the formed semiconductor structure.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:

1. A method for forming a semiconductor structure, comprising:
   forming a base substrate;
   forming a gate structure on the base substrate;
   forming openings in the base substrate on both sides of the gate structure;
   after forming the opening, performing an amorphization treatment to a bottom portion of the openings to prevent atoms from depositing on the bottom portion of the openings;
   after performing an amorphization treatment to a bottom portion of the openings, forming a barrier layer completely covering sidewalls of the openings adjacent to the gate structure and exposing a bottom surface of the openings;
   after forming the barrier layer, performing a recrystallization treatment to the bottom portion of the openings; and
   after performing a recrystallization treatment to the bottom portion of the openings, forming a doped layer in the openings and a source region or a drain region in the doped layer, wherein the source region and the drain region are isolated from a portion of the base substrate directly under the gate structure by the barrier layer.

2. The method of claim 1, wherein a material of the barrier layer is same as a material of the base substrate.

3. The method of claim 1, wherein:
   the base substrate is a silicon substrate; and
   the barrier layer includes a silicon seed layer.

4. The method of claim 1, wherein a thickness of the barrier layer is in a range from 35 Å to 100 Å.

5. The method of claim 1, wherein the barrier layer is formed on all sidewalls of the openings.

6. The method of claim 1, wherein the amorphization treatment includes:
   performing an ion-implanting process to the bottom portion of the openings.

7. The method of claim 6, wherein the ion-implantation process includes:
   injecting carbon ions into the bottom portion of the openings to amorphize the bottom portion of the openings.

8. The method of claim 1, wherein the recrystallization treatment includes:
   performing an annealing treatment to the bottom portion of the openings to realize a recrystallization of the bottom portion of the openings.

9. The method of claim 1, wherein forming the doped layer in the openings includes:
   filling the openings with a semiconductor material; and
   performing an in-situ ion doping during the filling process to form the doped layer.

10. The method of claim 9, wherein a dopant concentration of the in-situ ion doping process is in a range from 1.0E21 atoms/cm$^3$ to 5.0E21 atom/cm$^3$.

11. The method of claim 9, further comprising:
after forming the doped layer, performing an annealing process to activate the doped layer to form a source region or a drain region.

12. The method of claim 11, wherein:
a temperature of the annealing process is in a range from 950° C. to 1100° C.; and
a duration time of the annealing process is in a range from 0 s to 10 s.

13. The method of claim 1, wherein:
the semiconductor structure is a fin field-effect transistor;
forming the base substrate includes providing a semiconductor substrate, and etching the semiconductor substrate to form a substrate and a plurality of fin portions on the substrate;
the gate structure crosses over the plurality of fin portions;
the openings are formed in plurality of fin portions on both sides of the gate structure; and
the material of the barrier layer is the same as a material of the plurality of fin portions.

14. The method of claim 1, wherein:
the base substrate includes a first region for forming a first type transistor and a second region for forming a second type transistor;
forming the gate structure includes forming a first gate structure on the base substrate in the first region, and forming a second gate structure on the base substrate in the second region,
after forming the gate structure, and before forming the openings, a second doped layer is formed in the base substrate on both sides of the second gate structure;
forming the openings includes forming the openings in the base substrate on both sides of the first gate structure; and
forming the doped layer includes forming a first doped layer in the openings, forming a first source region or a first drain region in the first doped region, and forming a second source region or a second drain in the second doped region.

* * * * *